United States Patent
Nittka

(10) Patent No.: US 10,048,344 B2
(45) Date of Patent: Aug. 14, 2018

(54) METHOD AND APPARATUS FOR GENERATING A MAGNETIC RESONANCE IMAGE USING COMBINED EXCITATION BY A WHOLE BODY COIL AND A LOCAL COIL

(71) Applicant: Siemens Aktiengesellschaft, Munich (DE)

(72) Inventor: Mathias Nittka, Baiersdorf (DE)

(73) Assignee: Siemens Aktiengesellschaft, Munich (DE)

( * ) Notice: Subject to any disclaimer, the term of this patent is extended or adjusted under 35 U.S.C. 154(b) by 531 days.

(21) Appl. No.: 14/719,709

(22) Filed: May 22, 2015

(65) Prior Publication Data

US 2015/0338488 A1 Nov. 26, 2015

(30) Foreign Application Priority Data

May 22, 2014 (DE) .................. 10 2014 209 783

(51) Int. Cl.
*G01V 3/00* (2006.01)
*G01R 33/561* (2006.01)
*G01R 33/34* (2006.01)
*G01R 33/56* (2006.01)
*G01R 33/385* (2006.01)
*G01R 33/28* (2006.01)
*G01R 33/36* (2006.01)

(52) U.S. Cl.
CPC ....... *G01R 33/5618* (2013.01); *G01R 33/288* (2013.01); *G01R 33/34046* (2013.01); *G01R 33/34092* (2013.01); *G01R 33/3664* (2013.01); *G01R 33/385* (2013.01); *G01R 33/5608* (2013.01)

(58) Field of Classification Search
CPC ............. G01R 33/5618; G01R 33/288; G01R 33/34046; G01R 33/34092; G01R 33/3664; G01R 33/385; G01R 33/5608
See application file for complete search history.

(56) References Cited

U.S. PATENT DOCUMENTS 4,629,988 A 12/1986 Bottomley
6,031,375 A 2/2000 Atalar et al.
(Continued)

FOREIGN PATENT DOCUMENTS

WO WO-2009/128013 A1 10/2009

OTHER PUBLICATIONS

Avdievich et al., Improved Homogeneity of the Transmit Field by Simultaneous Transmission with Phased Array and Volume Coil, J Magn Reson Imaging, 32(2):476-481, Aug. 2010.*
(Continued)

Primary Examiner — Daniel Miller
(74) Attorney, Agent, or Firm — Schiff Hardin LLP

(57) ABSTRACT

In a method and magnetic resonance (MR) apparatus for producing an MR image of an examination object with an MR imaging sequence, at least one RF pulse is radiated by a whole body coil of the MR scanner of the MR apparatus during the imaging sequence, at least one RF pulse is radiated by a local transmit coil of the MR scanner during the imaging sequence, MR signals that are generated by the combined radiated RF pulses are read out, and an MR image is reconstructed from the read-out MR signals.

14 Claims, 3 Drawing Sheets

(56) References Cited

U.S. PATENT DOCUMENTS

| | | |
|---|---|---|
| 6,975,114 B1 | 12/2005 | Ledden |
| 8,779,767 B2 | 7/2014 | Umeda |
| 2004/0263166 A1 | 12/2004 | Kluge |
| 2008/0079430 A1 | 4/2008 | Nistler et al. |
| 2009/0091326 A1 | 4/2009 | Fischer et al. |
| 2009/0179645 A1 | 7/2009 | Diehl et al. |
| 2009/0274353 A1* | 11/2009 | Martin .................. G01R 33/54 382/131 |
| 2010/0079141 A1* | 4/2010 | Stemmer ............ G01R 33/4824 324/309 |
| 2011/0128000 A1 | 6/2011 | Harvey |
| 2011/0148410 A1* | 6/2011 | Zaitsev .............. G01R 33/5611 324/309 |
| 2011/0152670 A1 | 6/2011 | Yang |
| 2013/0225975 A1* | 8/2013 | Harvey ................ A61B 5/0037 600/411 |
| 2014/0225613 A1* | 8/2014 | Reykowski ........ G01R 33/3628 324/309 |
| 2015/0022208 A1 | 1/2015 | Biber |

OTHER PUBLICATIONS

Overall et al: Optically Coupled Op Amp Transmitter for use with Interventional Microcoils; Proc. Intl. Soc. Mag. Reson. Med. 13; p. 2655; (2005).

Avdievich et al.; "Improved Homogeneity of the Transmit Field due to Simultaneous Transmission with Phased Arrays and Volume Coils."; Proc. Intl. Soc. Mag. Reson. Med. 14; p. 2567; 2006; XP040598084.

* cited by examiner

METHOD AND APPARATUS FOR GENERATING A MAGNETIC RESONANCE IMAGE USING COMBINED EXCITATION BY A WHOLE BODY COIL AND A LOCAL COIL

BACKGROUND OF THE INVENTION

Field of the Invention

The present invention concerns a method and an apparatus for acquiring magnetic resonance (MR) signals from an examination object in an MR system that has a whole body coil and a local transmit coil.

Description of the Prior Art

In medical MR diagnostics, different methods are known for maximizing the signal quality and the contrast of the signal. These methods generally require the use of electromagnetic RF fields with a high field strength. The RF fields excite and refocus nuclear spins in the subject across the entire volume of the examination object in order to cause the spins to emit MR signals. A partial absorption of the radiated energy by the examination object, and thus a temperature elevation, occur in the process. A measure of this absorption or heating is the specific absorption rate (SAR). To prevent excessive heating, legal limit values exist for the SAR, which define which maximum energy output can be deposited in an object of a specific weight. To prevent these limit values from being exceeded, MR systems according to the current prior art make use of local volume coils for RF field generation for specific parts of an examination object. These fields are spatially limited and thus have a lower SAR. They are suited to body regions that can be completely surrounded by such a local volume coil. Examples are local volume coils for a knee or the head. Furthermore, local volume coils can achieve a reduction in the encoding time by reducing the measurement region from which the MR signals must be encoded, which can shorten the overall duration of the examination.

Even with special imaging, for instance in the case of implants, chemical-shift artifacts or spectroscopy, local transmit coils are advantageous because they can generate the highest possible amplitudes and bandwidths in a spatially restricted manner.

A notable drop in the field strength, however, frequently occurs at the edges of the field of the local volume coil.

If desired, imaging of the examination object encompasses body parts that cannot be enclosed, or can only be enclosed with difficulty, local volume coils cannot be used. Lower intensities for the refocusing pulse must therefore be accepted, which results in the quality of the image being impaired.

Known methods for maximizing the quality and the contrast of the MR signal require the highest possible RF field strengths, but this entails an increased heating of the examination object.

The use of transmitting TX surface coils for exciting a limited part of the examination region allows a low SAR to be achieved, but nevertheless has the serious disadvantage of not being able to generate a sufficiently homogeneous excitation field. The generation of an excitation field that is as homogeneous as possible is necessary, because only an MR image with a high contrast and a high quality can be generated as a result. Transmitting TX surface coils are therefore not often used in practice for exciting the examination object. From the point of view of the imaging sequence, an inhomogeneous excitation field results in a variation of the flip angle of the nuclear spins across the imaging volume, which in turn negatively influences the image contrast and the signal-to-noise ratio. It is desirable to obtain contrast that is as constant and well defined as possible at the same time as obtaining a signal-to-noise ratio that is as high as possible.

The use of spatially limited volume coils solves this problem, but only those parts of the examination object that can be completely enclosed by the volume coil can be examined in this way. Other parts, such as e.g. a shoulder, the hips or the spinal column, cannot be enclosed by volume coils, as a result of which the examination based on a spatially limited coil is significantly hampered.

SUMMARY OF THE INVENTION

An object of the present invention is to provide a method that allows for the excitation of any part of the examination object while adhering to the prespecified limit values for SAR and at the same time achieving a high imaging quality.

During an imaging sequence in accordance with the invention, at least one RF pulse is first radiated across the entire examination object by a whole body coil.

The advantage of this radiation by the whole body coil allows as homogeneous an excitation of the examination object as possible to be achieved.

Radiation of at least one RF pulse by a local transmit coil then takes place.

This pulse is advantageously used to flip the spins that precess after the excitation with different phases and thus diverge, so that they merge again and can thus generate an echo signal.

In the next step, an MR image is reconstructed from the MR signals (MR data) that are read out following the combined excitation by the whole body coil and the local coil.

In a preferred exemplary embodiment, the imaging sequence has a read-out module, in which at least one RF refocusing pulse is radiated to generate a spin echo, with the at least one RF refocusing pulse being radiated with the local transmit coil. The combination of an excitation pulse with one or more RF refocusing pulses represents a turbo spin echo sequence.

The RF refocusing pulses can be produced in a preferred exemplary embodiment such that they excite the examination object at a flip angle of between 150 and 180 degrees. An advantage of this step is that the refocusing pulse is radiated with the local transmit coil, and as a result an absorption of the radiated energy (SAR, specific absorption rate) by the examination object, and thus heating of the examination object, is minimized.

In a further preferred exemplary embodiment, the imaging sequence has a preparation module that precedes the read-out module, in which at least one RF excitation pulse prepares the magnetization of the examination object and which is radiated by the whole body coil.

This RF excitation pulse rotates the spins from a position of equilibrium by 90 degrees into the plane of the magnetic field direction of the preceding excitation pulse.

This RF excitation pulse is advantageously transmitted by the whole body coil, because this produces a homogeneous magnetic field and nuclear spins in the entire examination region thus can be excited in as homogeneous a manner as possible, so the quality of the MR image is as high as possible.

In a further exemplary embodiment, the preparation module can include a RF preparation pulse for suppressing unwanted MR signal parts in the read-out module. This RF preparation pulse is radiated by the whole body coil.

This means that the examination object has a better contrast in the MR image and the interfering influence of unwanted MR signals is reduced.

An MR system in accordance with the invention implements the method as described above, and includes a whole body coil and a local transmit coil, which are designed to emit RF pulses. Furthermore, the MR system includes a receive coil, which is designed to receive the resulting spin echo signals from the examination object.

Furthermore, the MR system has an RF control unit, which controls the emission of RF pulses of the whole body coil and the local transmit coil. The RF control unit controls the coils such that the whole body coil radiates at least one RF pulse during the imaging sequence and the local transmit coil irradiates at least one RF pulse during the imaging sequence.

In addition, the MR system has an image processor that reconstructs an MR image from the received spin echo signals.

This arrangement results in the MR image having a high quality, and at the same time SAR is minimized.

The local transmit coil can be freely positioned within the examination region. This means that parts of the examination object, which are not accessible or only accessible with difficulty with a local volume coil, can be radiated with RF pulses. Those skilled in the art can thus radiate RF refocusing pulses only in a part of the examination object, for instance, and thus achieve a minimization of the SAR of the examination object.

The imaging sequence determines how the RF control unit controls the whole body coil and the local transmit coil and operates as described above.

The user of the inventive apparatus and method is thus advantageously able to individually subject examination regions, which cannot be spatially enclosed by volume coils, to an imaging sequence. In this case the local transmit coil is configured to radiate the magnetic refocusing pulse so that the magnetic field is spatially limited and only operates on the examination region. This allows those skilled in the art, when adhering to the maximum SAR allowed, to maximize the amplitudes of the irradiated refocusing pulses and thus to increase the quality of the signals from the examination region. At the same time, the energy absorption (SAR) in the examination object and the heating of the examination object associated therewith are minimized.

DESCRIPTION OF THE PREFERRED EMBODIMENTS

Figure 1:
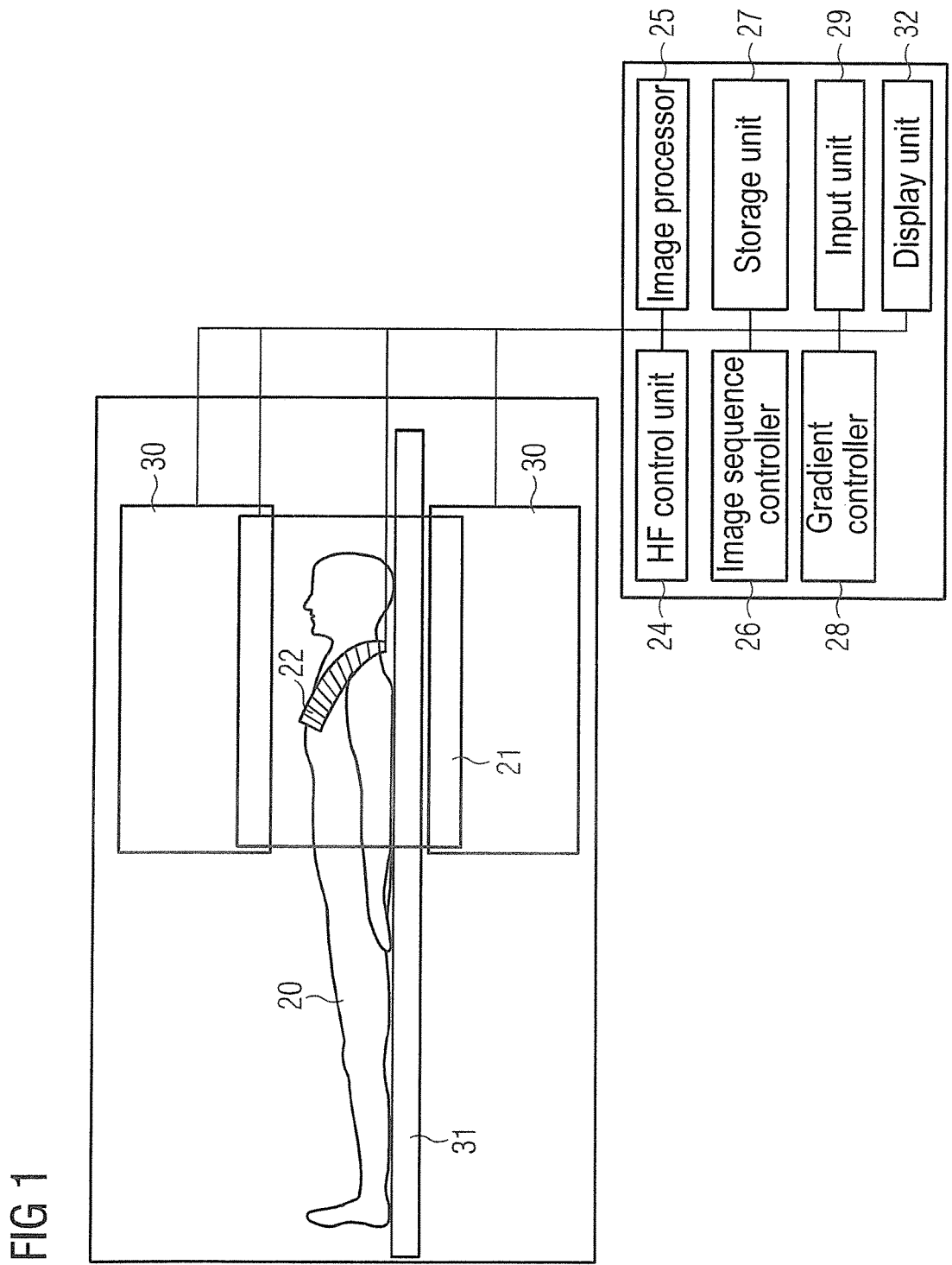
FIG. 1 is a schematic representation of the inventive MR system.

FIG. 1 is a schematic representation of the MR system. In this system, a basic field magnet 30 of an MR scanner generates a temporally constant strong magnetic field for the polarization or alignment of the nuclear spin in an examination object 20.

Figure 2:
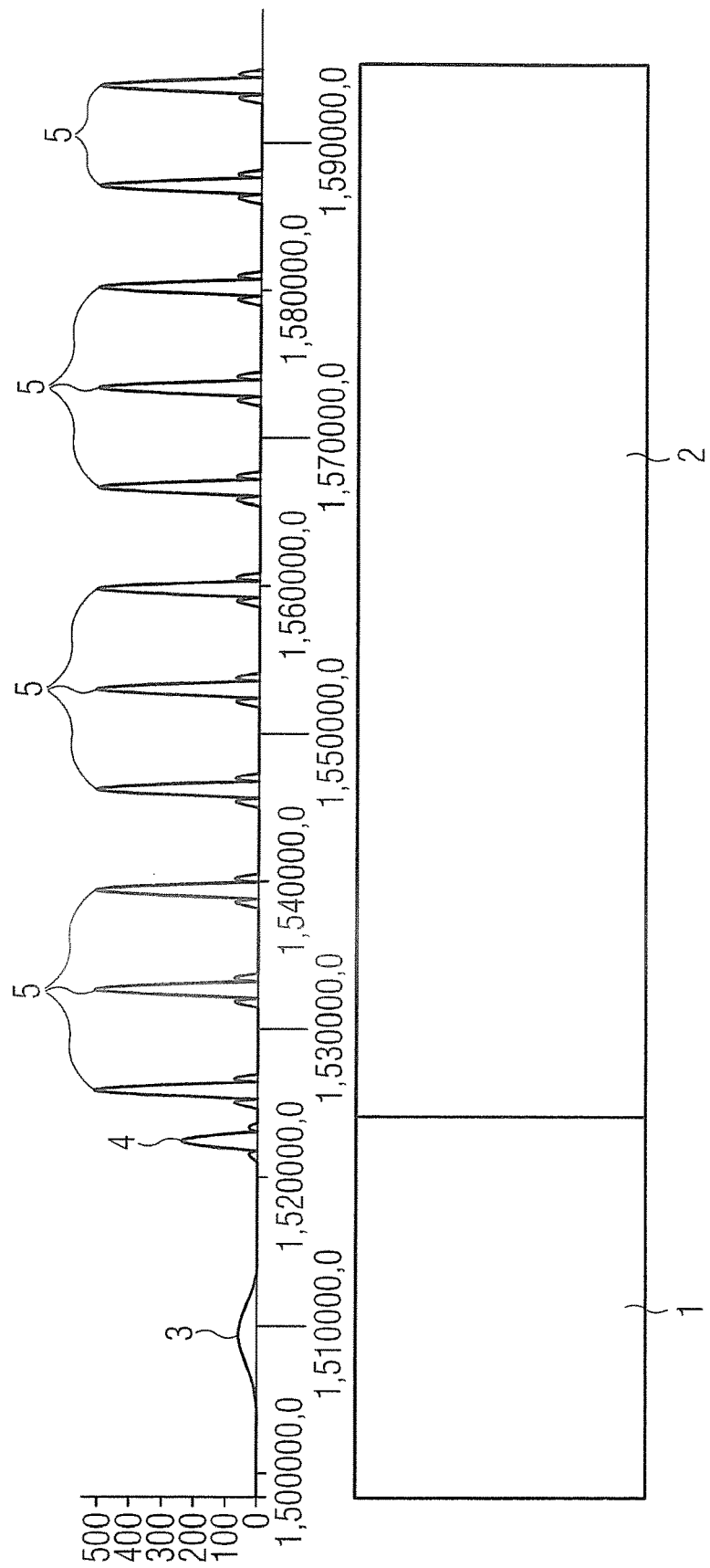
FIG. 2 shows the different modules and the RF pulse in accordance with the invention.

The examination object 20 is now moved into the MR scanner on a bed 31. In the MR scanner, a whole body coil 21 generates a RF field for generating RF excitation pulses and RF preparation pulses, which are part of the excitation module, which is shown in FIG. 2.

FIG. 1 also shows the local transmit coil/receive coil 22, which is designed to cover or partially enclose specific parts of the examination object 20. Furthermore, the local transmit coil/receive coil 22 can be freely positioned within the examination region of the MR scanner. In the inventive embodiment of the MR scanner, it is thus possible for parts of the examination object 20 which are difficult to access to be able to be covered in a simple manner. Parts of the examination object which are difficult to access, such as e.g. the spinal column, a hip or a shoulder, cannot be covered or can only be covered with difficulty by a fixedly installed local transmit coil. The free mobility of the local transmit coil/receive coil 22 can however be used to examine parts of the examination object 20 which are difficult to access.

FIG. 1 also shows the control of the MR scanner, which includes an RF control unit 24, an image sequence controller 26, a gradient controller 28, an image processor 25, a storage unit 27, a display unit 32 and an input unit 29.

The RF control unit 24 controls the RF pulses of the whole body coil 21 and the local transmit coil/receive coil 22. In this case the RF control unit 24 selects the RF pulses such that the whole body coil and the local transmit coil/receive coil 22 irradiate at least one RF pulse in each case during the imaging sequence.

The image sequence controller 26 defines the nature of the widths, the amplitudes and the number of RF preparation pulses, the RF excitation pulse and the RF refocusing pulse.

FIG. 1 also shows a gradient controller 28, which is used to control the magnetic field gradients that are generated by gradient coils of the MR scanner.

In order to store the data of the RF signals, the MR system comprises a storage unit 27. An input unit 29 is coupled to the MR system to allow operation of the MR system by the user.

Furthermore, an image processor 25 exists, which analyses the RF signals and prepares them in such a way that they can be shown in an MR image. A display unit 32 represents the MR image.

FIG. 2 shows the different modules and pulses which are generated by the imaging sequence in the MR scanner. A preparation module 1 firstly contains an RF excitation pulse 4. This RF excitation pulse 4 is designed such that it homogeneously excites the entire volume of the examination object so that all spins are rotated by 90 degrees into the plane of the magnetic field of the RF excitation pulse 4. The most exact alignment possible of the spins into the plane of the magnetic field results in an improvement in the quality of the imaging.

FIG. 2 further shows an RF preparation pulse 3, which can be irradiated in a preferred embodiment prior to the RF excitation pulse 4. This RF preparation pulse 3 is designed such that it excites nuclear spins in specific tissue parts, for instance fat tissue, such that they generate the lowest possible MR signals in the overall imaging sequence. MR signals from tissue parts which interfere with the imaging sequence or are not important, are thus reduced.

Furthermore, FIG. 2 shows a read-out module 2, which contains at least one RF refocusing pulse 5. The at least one RF refocusing pulse 5 is used to tilt the aligned spins, which precede after excitation with different phases and therefore diverge, by 150-180 degrees, so that they merge again and thus generate an MR signal.

FIG. 2 shows the nature of the RF preparation pulse 3, the RF excitation pulse 4 and the RF refocusing pulse 5 precisely. In this case the RF refocusing pulses 5 have as high an amplitude as possible and a brief pulse duration in order to increase the quality of the RF signals. In this case the SAR (specific absorption rate) of the examination object is minimized since it is radiated by the local transmit coil/receive coil and therefore only operates in a limited part of the examination object.

The RF excitation pulse 4 is radiated with the whole body coil and therefore operates on the entire examination object. Accordingly the SAR can reach high values, which results in the amplitude being selected lower compared with the RF refocusing pulses 5.

This arrangement advantageously means that the MR image can generate a high quality and at the same time a minimized SAR (specific absorption rate).

The RF preparation pulse 3 is selected such that it fades unwanted signals out from the examination object. The nature of the RF preparation pulse 3 can be selected in an embodiment such that it comprises a long pulse duration and a low amplitude. Other embodiments are likewise possible.

As shown in FIG. 2, the imaging sequence may comprise a contrast preparation by the RF pulse 3. This RF pulse for contrast generation is transmitted with the whole body coil, in order to achieve as homogeneous a contrast as possible, while the read-out module is transmitted with the local coil, in order to achieve the advantages of the local coil such as a reduced SAR, a reduced imaging volume for a shortening of the measurement time and a quicker imaging by shorter pulses, which use an increased B1 amplitude of the local coils. In a further embodiment, the imaging sequence can however be a rapid spin echo sequence without the RF pulse 3 and only with the RF pulses 4 and 5. Since on account of the low flip angle of 90° and the lower frequency the excitation pulse is less critical from the point of view of B1 amplitude and SAR, this pulse is advantageously transmitted with the whole body coil. The flip angles of the refocusing pulses have by contrast less influence on the image quality, since although a lower flip angle reduces the signal of the direct spin echo, this is, however, at least partially compensated for by an increased number of signal by stimulated echos. Because of the radiations of the refocusing pulse with the local coil, the SAR can be induced, wherein the overall SAR of the sequence is dominated by the SAR of the refocusing pulse. Similarly, the image quality can be improved by shorter pulses with higher B1 amplitudes.

Figure 3:
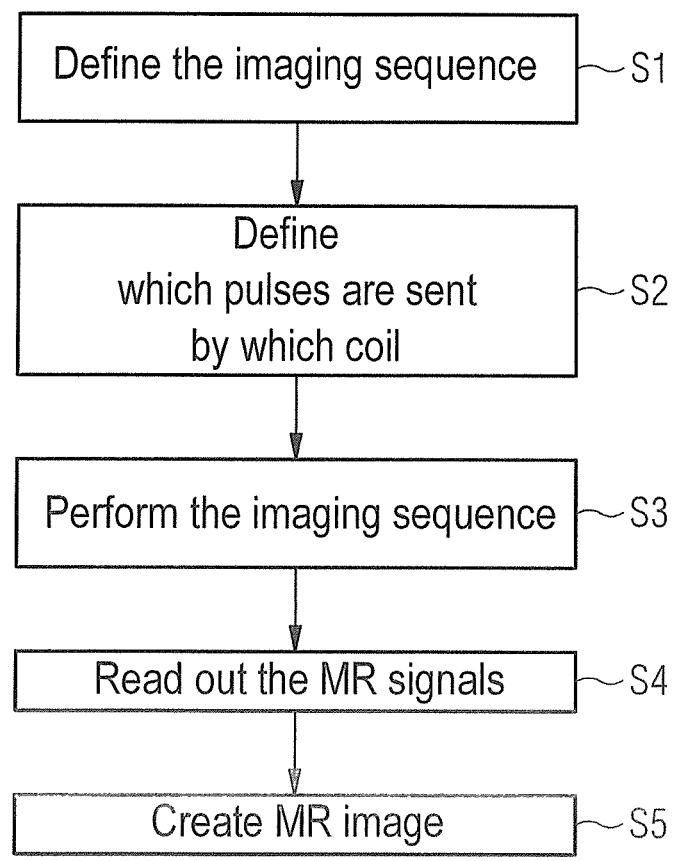
FIG. 3 is a flowchart of the inventive method.

FIG. 3 shows a flow chart of the inventive method to create an MR image. In this chart, in the first step S1, the imaging sequence is defined, which defines the number and the nature of the RF pulses. In step S2, the method determines whether the whole body coil or the local transmit coil/receive coil transmits the different RF pulses. The imaging sequence is subsequently executed in step S3, wherein the sequence of RF pulses defined in step S1 is used. In step S4, the generated MR signals are read out and stored. In step S5, the MR image is finally created on the basis of the data from step S4.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for generating a magnetic resonance (MR) image of a subject, comprising:
    operating an MR scanner in an imaging sequence while a subject is situated in the MR scanner, to radiate at least one radio frequency (RF) pulse, of a first RF pulse type, that originates exclusively from with a whole body coil of the MR scanner;
    also in said MR data acquisition sequence, operating the MR scanner to radiate at least one further RF pulse of a second RF pulse type that is different from said first RF pulse type, that originates exclusively from with a local coil in the MR scanner;
    in said MR data acquisition sequence, said RF pulse radiated exclusively from said whole body coil and said further RF pulse radiated exclusively from said local coil producing a combination that excites nuclear spins in the subject, with said RF pulse radiated exclusively by said whole body coil and said further RF pulse radiated exclusively by said local coil respectively making individual, different contributions to said combination, respectively dependent on said first RF pulse type and said second RF pulse type;
    operating the MR scanner to read out MR signals resulting from nuclear spins excited by said combination of said at least one RF pulse radiated by said whole body coil and said at least one further RF pulse radiated by said local coil; and
    in a processor, reconstructing an MR image from the read-out MR signals.

2. A method as claimed in claim 1 comprising operating said MR scanner with a read-out module in said imaging sequence and, in said read-out module, radiating at least one RF refocusing pulse with said local coil and thereby generating a spin echo from said nuclear spins.

3. A method as claimed in claim 2 comprising, in said read-out module, operating said MR scanner to radiate a plurality of RF refocusing pulses with said local coil.

4. A method as claimed in claim 2 comprising operating said MR scanner with a preparation module in said imaging sequence that precedes said read-out module and, in said preparation module, preparing magnetization of said nuclear spins in said subject by radiating at least one RF excitation pulse with said whole body coil before reading out said MR signal in said read-out module.

5. A method as claimed in claim 4 comprising, in said preparation module, radiating said RF excitation pulse with said whole body coil to produce a magnetization of said subject that deflects said nuclear spins from an equilibrium position, for generating said MR signals.

6. A method as claimed in claim 4 comprising, in said preparation module, radiating an RF preparation pulse with said whole body coil that suppresses unwanted signal contributions in said readout module.

7. A magnetic resonance (MR) apparatus comprising:
    an MR scanner comprising a whole body coil and a local coil;
    a control computer configured to operate said MR scanner in an imaging sequence while a subject is situated in the MR scanner, to radiate at least one radio frequency (RF) pulse, of a first RF pulse type, that originates exclusively from said whole body coil of the MR scanner;
    said control computer being configured to operate the MR scanner also in said MR data acquisition sequence, to radiate at least one further RF pulse of a second RF pulse type that is different from said first RF pulse type, that originates exclusively from said local coil in the MR scanner;
    in said MR data acquisition sequence, said RF pulse radiated exclusively from said whole body coil and said further RF pulse radiated exclusively from said local coil producing a combination that excites nuclear spins in the subject, with said RF pulse radiated exclusively by said whole body coil and said further RF pulse radiated exclusively by said local coil respectively making individual, different contributions to said combination, respectively dependent on said first RF pulse type and said second RF pulse type;

said control computer being configured to operate the MR scanner to read out MR signals resulting from nuclear spins excited by said combination of said at least one RF pulse radiated by said whole body coil and said at least one further RF pulse radiated by said local coil; and said control computer being configured to reconstruct an MR image from the read out MR signals.

8. An apparatus as claimed in claim 7 wherein said control computer is configured to operate said MR scanner with a read-out module in said imaging sequence and, in said read-out module, operate said local coil to radiate at least one RF refocusing pulse and thereby generate a spin echo from said nuclear spins.

9. An apparatus as claimed in claim 7 wherein said control computer being configured to operate said MR scanner in said read-out module to radiate a plurality of RF refocusing pulses with said local coil.

10. An apparatus as claimed in claim 8 wherein said control computer is configured to operate said MR scanner with a preparation module, said imaging sequence that precedes said read-out module and, in said preparation module, to prepare magnetization of said nuclear spins in said subject by radiating at least one RF excitation pulse with said whole body coil before reading out said MR signal in said read-out module.

11. An apparatus as claimed in claim 10 wherein said control computer is configured to operate said MR scanner in said preparation module to radiate said RF excitation pulse with said whole body coil to produce a magnetization of said subject that deflects said nuclear spins from an equilibrium position, for generating said MR signals.

12. An apparatus as claimed in claim 10 wherein said control computer is configured to operate said MR scanner in said preparation module to radiate an RF preparation pulse with said whole body coil that suppresses unwanted signal contributions in said readout module.

13. An MR apparatus as claimed in claim 7 wherein said whole body coil spatially encloses an entirety of an examination region in said MR scanner.

14. An MR system as claimed in claim 7 wherein said local coil is configured to conform to a selected anatomy of the subject.

* * * * *